United States Patent [19]

Moriyama

[11] Patent Number: 5,371,751
[45] Date of Patent: Dec. 6, 1994

[54] METHOD OF CORRECTING ERRORS OF CODED DATA

[75] Inventor: Yoshiaki Moriyama, Tokorozawa, Japan

[73] Assignee: Pioneer Electronic Corporation, Tokyo, Japan

[21] Appl. No.: 718,467

[22] Filed: Jun. 20, 1991

[30] Foreign Application Priority Data

Sep. 12, 1990 [JP] Japan .................................. 2-241431

[51] Int. Cl.⁵ ...................... G06F 11/10; H03M 13/00
[52] U.S. Cl. .................................... 371/39.1; 371/37.1
[58] Field of Search ................. 371/39.1, 37.1, 38.1, 371/37.2, 41, 37.4

[56] References Cited

U.S. PATENT DOCUMENTS

| Re. 33,332 | 9/1990 | Furuya et al. | 371/37.4 |
| 4,644,544 | 2/1987 | Furuya et al. | 371/37 |
| 4,961,193 | 10/1990 | Debord et al. | 371/38 |
| 4,979,174 | 12/1990 | Cheng et al. | 371/41 |
| 5,070,503 | 12/1991 | Shikakura | 371/37.1 |

Primary Examiner—Robert W. Beausoliel, Jr.
Assistant Examiner—Phung My Chung
Attorney, Agent, or Firm—Sughrue, Mion, Zinn, Macpeak & Seas

[57] ABSTRACT

A method of correcting triple-coded data, in which data coded in three different directions is subjected to error correction by referring to first, second and third codes, as well as a first flag determined by the first code and a second flag determined by the second code and other conditions, whereby this method demonstrates high error correcting performance with respect particularly to a burst error.

11 Claims, 9 Drawing Sheets

Fig. 5

| N2 | ○ | | 1 | | | 2 | |
|---|---|---|---|---|---|---|---|
| F1(E) | × | 1 | 2× | × | 1○ | 2○ | 1× | 2○ |

○ CORRECT   × NO CORRECTION

CORRECTION

Fig. 7

| N2 | ○ | | | 1 | | | | 2 | | |
|---|---|---|---|---|---|---|---|---|---|---|
| F1(E) | | 0 | | | 0 | | 2 | 0,× | 1,× | 2,2 |
| F1(S) | 0 | 1 | 2 | 0 | 1 | 2 | 0 | 1 | 2 | 0 | 1 | 2 | 0 | 1 | 2 | 0 | 1 | 2 |
| F2 | 0 | 0 | 0 | 0 | 0 | 0 | 1 | 1 | 1 | 0 | 0 | 0 | 1 | 1 | 1 | 0 | 0 | 1 |

Fig. 8

| N2 | ○ | | | 1 | | | | 2 | | |
|---|---|---|---|---|---|---|---|---|---|---|
| F1(E) | | 0 | | | 0 | | 2 | | | |
| F1(S) | 0 | 1 | 2 | 0 | 1 | 2 | 0 | 1 | 2 | 0 | 1 | 2 | 0 | 1 | 2 | 0 | 1 | 2 |
| F2 | 0 | 0 | 0 | 0 | 0 | 0 | 1 | 1 | 1 | 0 | 0 | 0 | 1 | 1 | 1 | 0 | 0 | 1 |

Fig. 10

| N2 | 0 | | | 1 | | | 2 | | |
|---|---|---|---|---|---|---|---|---|---|
| F1(S) | 1 | 2 | 1 | 1 | 2 | 1 | 1 | 2 | 1 |
| L | — | — | — | — | 1 | — | — | 1 | — |
| F2 | 0 | 0 | 0 | 0 | 0 | 0 | 0 | 1 | 1 |

L = 1 : ERROR POSITION
0 : NO ERROR POSITION
— : NO ERRORS

Fig. 11

| N2 | 0 | | 1 | | 2 | |
|---|---|---|---|---|---|---|
| F1(E) | 0 | 1 | 0 | 1 | 0 | 1 |
| | × | × | × | 0 | 0 | 0 |

CORRECTION

○: CORRECT   ×: NO CORRECTION

Fig. 12

| N2 | 0 | | | 1 | | | 2 | | |
|---|---|---|---|---|---|---|---|---|---|
| F1(S) | — | 1 | — | — | 1 | — | — | 1 | — |
| L | — | — | — | — | 1 | — | — | 1 | — |
| F2 | 0 | 0 | 0 | 0 | 0 | 0 | 0 | 1 | 1 |

- • : ERROR RESULTING FROM ERRONEOUS CORRECTION
- × : RANDOM ERROR

○ --- DATA

⇩ TIME

10

METHOD OF CORRECTING ERRORS OF CODED DATA

BACKGROUND OF THE INVENTION

1. Field of the Invention

The present invention relates to a method of correcting errors in triple-coded data through a transmission medium which is likely to cause a burst error.

2. Description of Background Information

An error correcting method of a double-coding system using Reed-Solomon codes is known to be used for a compact disk (CD). According to this method, a 1-bit flag F1 is generated after correction is done with the first code, and when two errors are to be corrected with the second code, whether or not the correction is to be made and the value of a flag F2 is determined by the number of symbols in a code word for which F1=1 and the number of those two errors acquired by the second code whose positions match the symbols with F1=1.

This method should, therefore, refer to the flags at the positions of two errors before correction is made, and is not suitable for a high-speed operation. Since the double-coding system and the error correcting method are designed to treat audio codes, the error correcting performance is insufficient for recording of computer data or the like.

The present inventors have proposed in Japanese Patent Application No. Sho 59-150764 the error correction coding and error correcting method which can be used in recording of computer data or the like. Although this error correcting method has a high performance of error correction, it is unsuitable for a high-speed operation due to the repetitive correction. Further, the method is incapable of sufficiently dealing with data which has many burst errors.

OBJECT AND SUMMARY OF THE INVENTION

It is therefore an object of the present invention to provide an error correcting method which can ensure a high-speed operation with high error correcting performance, and can treat computer data, image data and so forth. The target in the present invention is data having undergone triple coding for error correction. It is another object of the present invention to ensure sufficiently high error correcting performance even with a burst error mixed in the data by reducing erroneous correction with the second code (false correction) and further by sufficiently enhancing the error correcting performance of the third code.

According to the first feature of the invention, there is provided a method of correcting errors of data having undergone triple coding for error correction with three codes in different directions, which method comprises the steps of executing error correction with a first code and generating a first flag concerning a number of errors; in error correction with a second code, acquiring a number of errors with the second code, determining whether or not correction at each error position is to be made with the second code based on the number of errors and the first flag at each error position with the second code, and generating a second flag corresponding to each symbol in the second code referring to the number of errors, the first flag at each error position, and the first flag for the each symbol in the second code; and in error correction with a third code, determining how to make the error correction referring to the second flag.

According to the second feature of the invention, there is provided a method of correcting errors of data having undergone triple coding for error correction with three codes in different directions, which method comprises the steps of executing error correction with a first code and generating a first flag concerning a number of errors; in error correction with a second code, acquiring a number of errors with the second code, determining whether or not correction at each error position is to be made with the second code based on the number of errors and the first flag at each error position with the second code, and generating a second flag corresponding to each symbol in the second code referring to the number of errors and the first flag for the each symbol in the second code, and in accordance with whether or not the each symbol in the second code is at an error position; and in error correction with a third code, determining how to make the error correction referring to the second flag.

According to the error correcting method for coded data of the first feature, in correcting errors of data having undergone triple coding for error correction with three codes in different directions, error correction is made with the first code and the first flag concerning the number of errors is generated. In performing error correction with the second code, the number of errors is acquired with the second code, whether or not correction at each error position is to be made with the second code is determined based on the number of errors and the first flag at each error position with the second code, and the second flag corresponding to each symbol in the second code is generated referring to the number of errors, the first flag at each error position, and the first flag for the each symbol in the second code. In executing error correction with the third code, how to make the error correction is determined referring to the second flag.

According to the error correcting method for coded data of the second feature, in correcting errors of data having undergone triple coding for error correction with three codes in different directions, error correction is made with the first code and the first flag concerning a number of errors is generated. In performing error correction with the second code, the number of errors is acquired with the second code, whether or not correction at each error position is to be made with the second code is determined based on the number of errors and the first flag at each error position with the second code, and the second flag corresponding to each symbol in the second code is generated referring to the number of errors and the first flag for the each symbol in the second code, and in accordance with whether or not the each symbol in the second code is at an error position. In executing error correction with the third code, how to make the error correction is determined referring to the second flag.

BRIEF DESCRIPTION OF THE DRAWINGS

FIGS. 5, 7, 8 and 10 to 12 are tables according to the embodiment of the present invention;

DETAILED DESCRIPTION OF PREFERRED EMBODIMENTS

Preferred embodiments of first and second features of the invention will now be described referring to the accompanying drawings.

Figure 1:
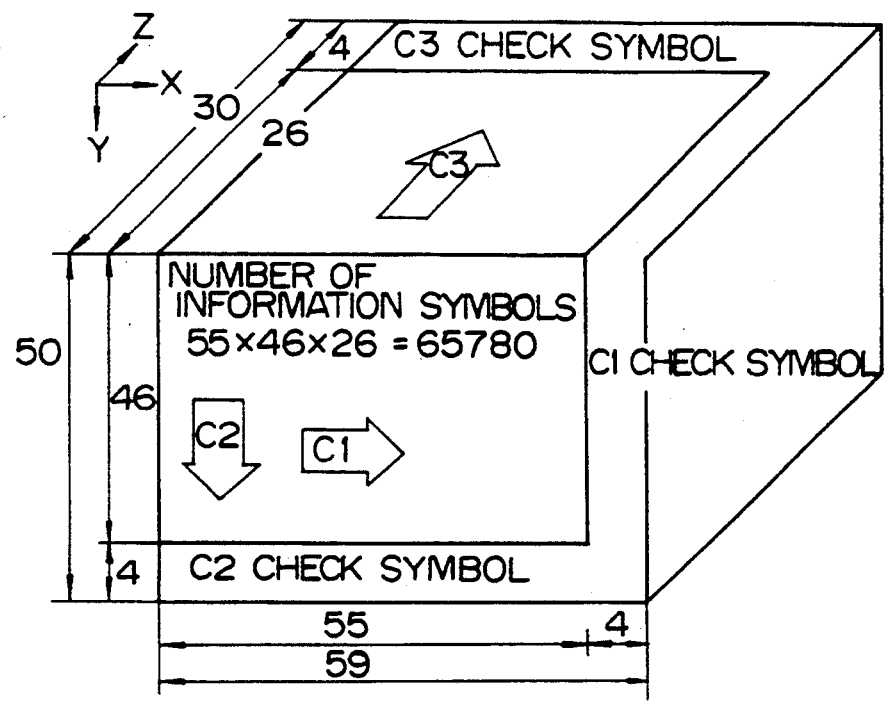
FIG. 1 is a diagram of a correction block which is the target for correction by one embodiment of the present invention.

FIG. 1 presents a correction block three-dimensionally coded in three different directions. As apparent from the diagram, the correction block is coded with codes C1, C2 and C3 respectively in the X, Y and Z directions, with four check symbols following information symbols in each direction.

C1, C2 and C3 are Reed-Solomon codes on a Galois field GF ($2^8$), and the information and check symbols each consist of eight bits. When expressed by the code length, the number of information symbols and the shortest distance, the individual codes will be

C1=(59, 55, 5) C2=(50, 46, 5) C3=(30, 26, 5)

Although the above structure increases the size of the correction block, it can reduce redundancy and enhance the random and burst error correcting performance, thus ensuring recording of computer data. Accordingly, it is possible to treat all data, such as image and sound, in the same physical format. What is common to the first and second inventions will be depicted with reference to FIGS. 2A, 2B and 3.

Figure 2A:
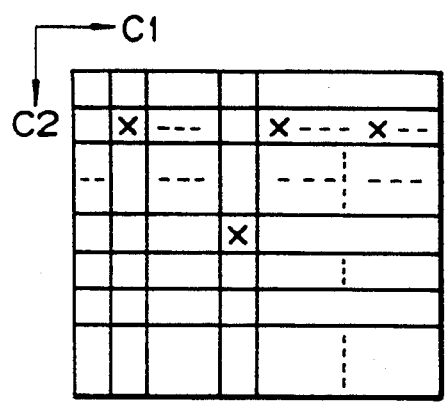
FIGS. 2A and 2B are diagrams showing part in which errors are included as illustrated in FIG. 1.
Figure 2B:
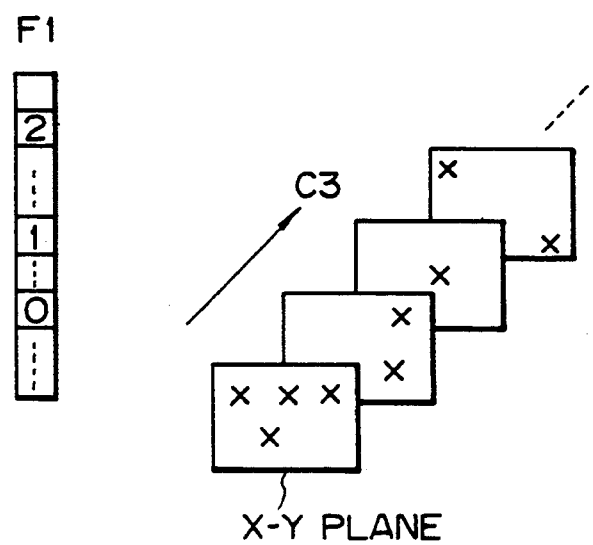

FIG. 2A shows errors (indicated by the mark "X") on a single X-Y plane of the block in FIG. 1; there are thirty X-Y planes in total in the Z direction, i.e. in the C3 direction as shown in FIG. 2B. Referring to FIG. 2A, F1, which is the first flag, and N2 both consist of two bits. F1 and N2 respectively represent the number of errors in the C1 and C2 codes in three forms, "0", "1" and "2 or greater" (which will be described later).

A description will now be given of a sequence of processes that is to be executed by a control section (not shown) including a microprocessor and memory.

Figure 3:
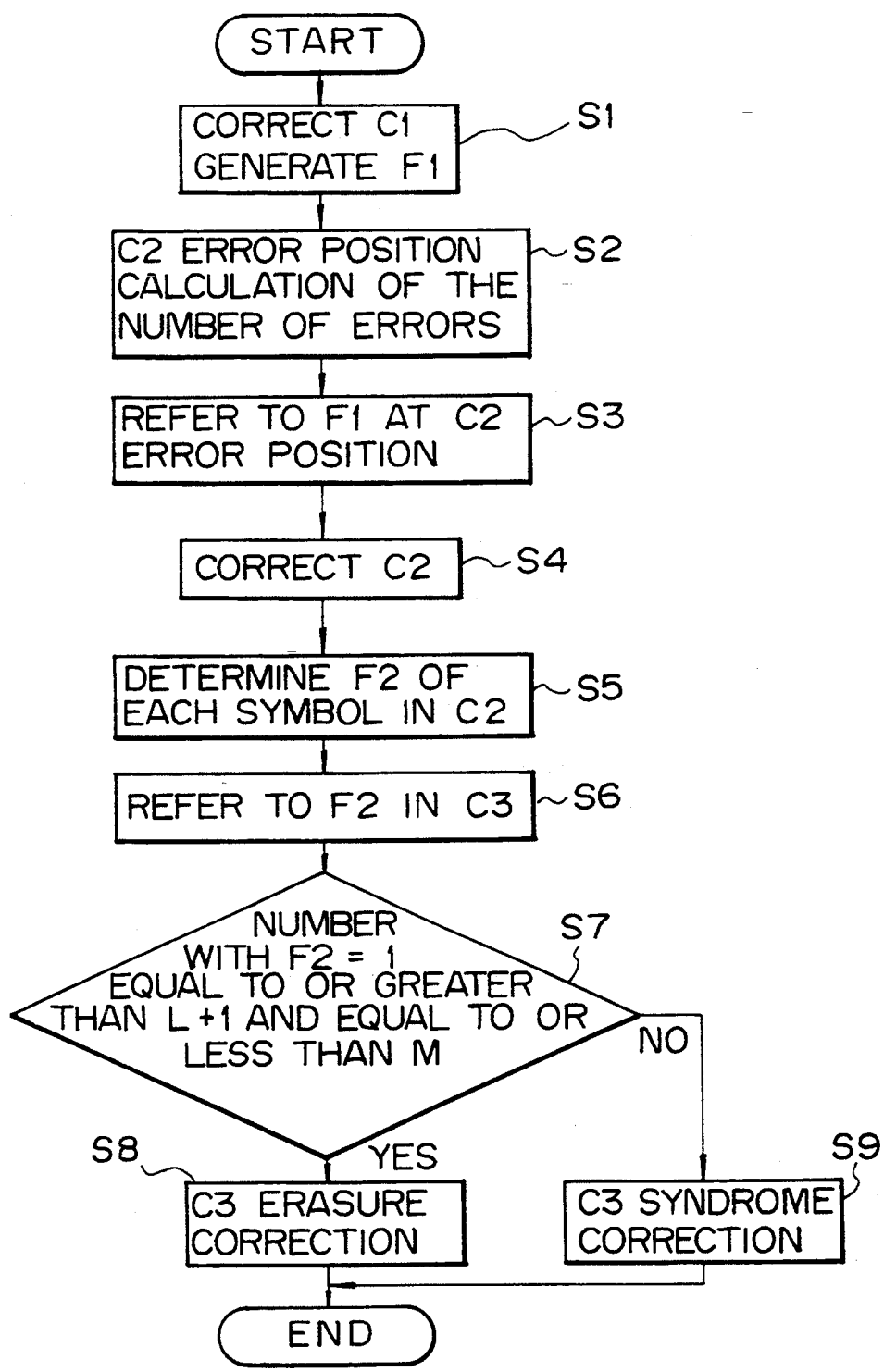
FIGS. 3, 4, 6 and 9 are flowcharts according to the embodiment of the present invention.

In the flowchart illustrated in FIG. 3, the correction of C1 will be made unconditionally and up to two corrections will be conducted by syndrome correction. The first flag F1, which represents the number of errors, "0", "1" or "2 or greater", when F1=0, 1 or 2 respectively, is generated (step S1). Then, the error position of the C2 code and the number of errors N2 are calculated (step S2). Referring to F1 at the error position of the C2 code (step S3), the correction of C2 is executed (step S4). The second flag F2 corresponding to each symbol in a C2 code word is then determined to be "0" or f"1" (step S5). Referring to F2 in a C3 code word, the number of the flags F2 (=1) is acquired (step S6). It is then determined whether or not the number of F2 (=1) lies within a predetermined range (assumed here to be equal to or greater than L+1 and equal to or less than M) (step S7). If the number is judged to be within the predetermined range, erasure correction is to be executed (step S8), and if it is judged otherwise, syndrome correction is to be executed (step S9).

The erasure correction corrects the symbols at the error position indicated by the flag F2 (=1); since the shortest distance is 5, four symbols at a maximum (i.e., M=4) can be corrected. In the syndrome correction the error position is acquired by the syndrome of a code itself, and the symbol at that position is corrected. In this case, up to two symbols (i.e., L=2) can be corrected.

Figure 4:
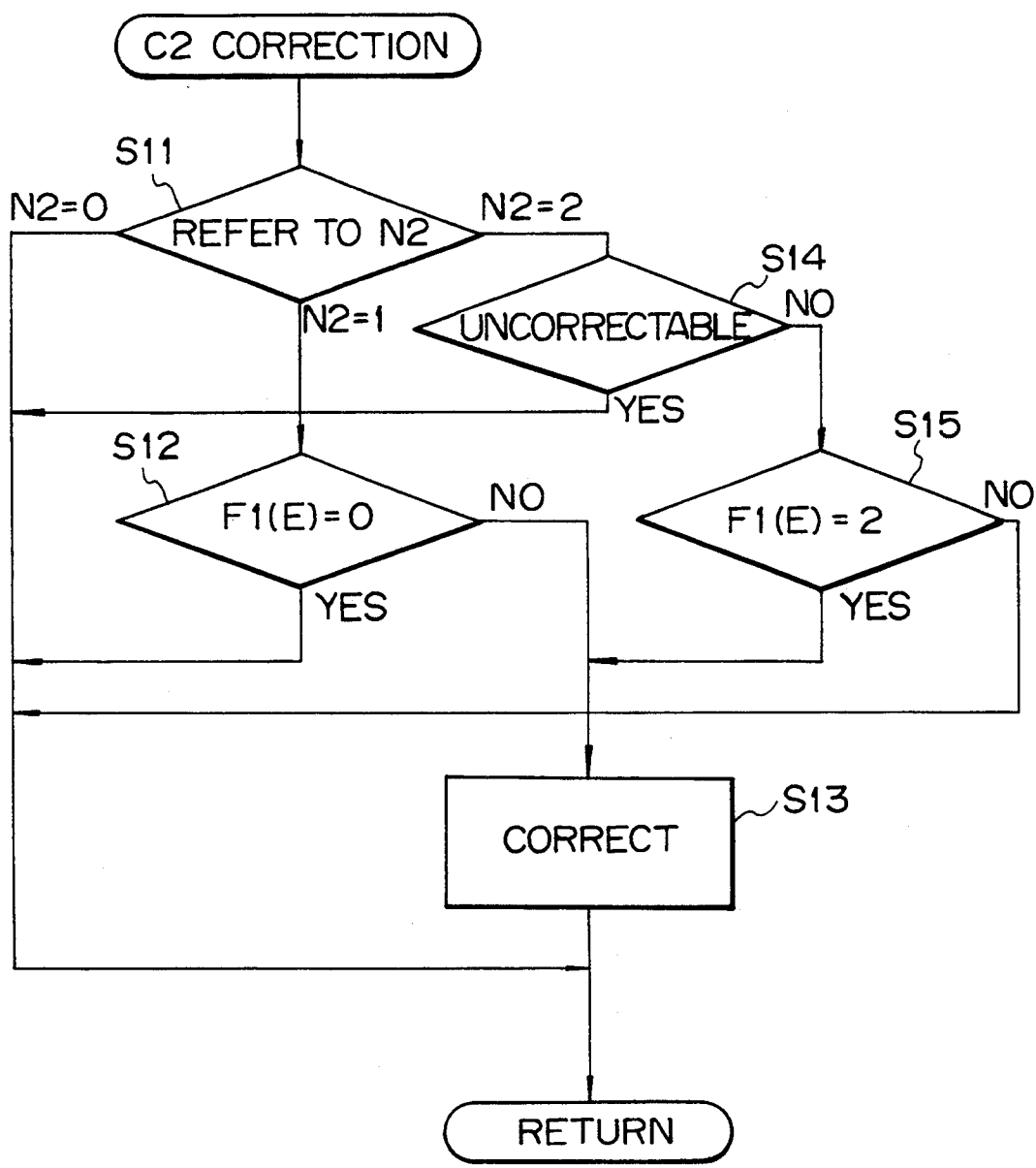

FIG. 4 exemplifies the details of step S4 in the flowchart in FIG. 3 (hereinafter called "main routine"). In FIG. 4, the number of errors, N2, acquired with the C2 code is referred to first (step S11). When N2=0, considering that no errors have occurred, the flow will return to the main routine without correction. When N2=1, it is judged if the first flag at the error position obtained with the C2 code (hereinafter simply called F1(E)) is "0", i.e., whether or not F1(E)=0 (step S12). If F1(E)=0, no correction will be made. If it is not judged that Fi(E)=0, the flow moves to step S13 to make the necessary correction before returning to the main routine.

If N2=2 in step S11, it is discriminated first whether or not correction is possible (step S14) because the fact that N2=2 indicates errors for two or more symbols and there are possibly three erroneous symbols or more in the actual C2 code word. It should however be noted that the correction of the C2 code involves the syndrome correction and the maximum number of correctable symbols are two as mentioned above. If it is judged in step S14 that no correction is possible, the flow will return to the main routine. If the decision in this step indicates possible correction or the number of erroneous symbols in the C2 code word is judged to be two, it is then determined whether or not F1(E) of the erred symbols equals two (step S15). If F1(E)=2, correction is made (step S13) before the flow returns to the main routine. If F1(E) is not judged equal to "2", i.e., it is either "1" or "0", the flow will return to the main routine without making any correction.

The process in step S5 in the main routine to determine F2 corresponding to each symbol in a C2 code word differs between the first and second inventions.

The embodiment of the first feature of the invention (hereinafter referred to as "first embodiment") will be described referring to FIGS. 5 to 7. FIG. 5 shows the subroutine for correcting C2 in FIG. 4 in the form of a table.

Figure 6:
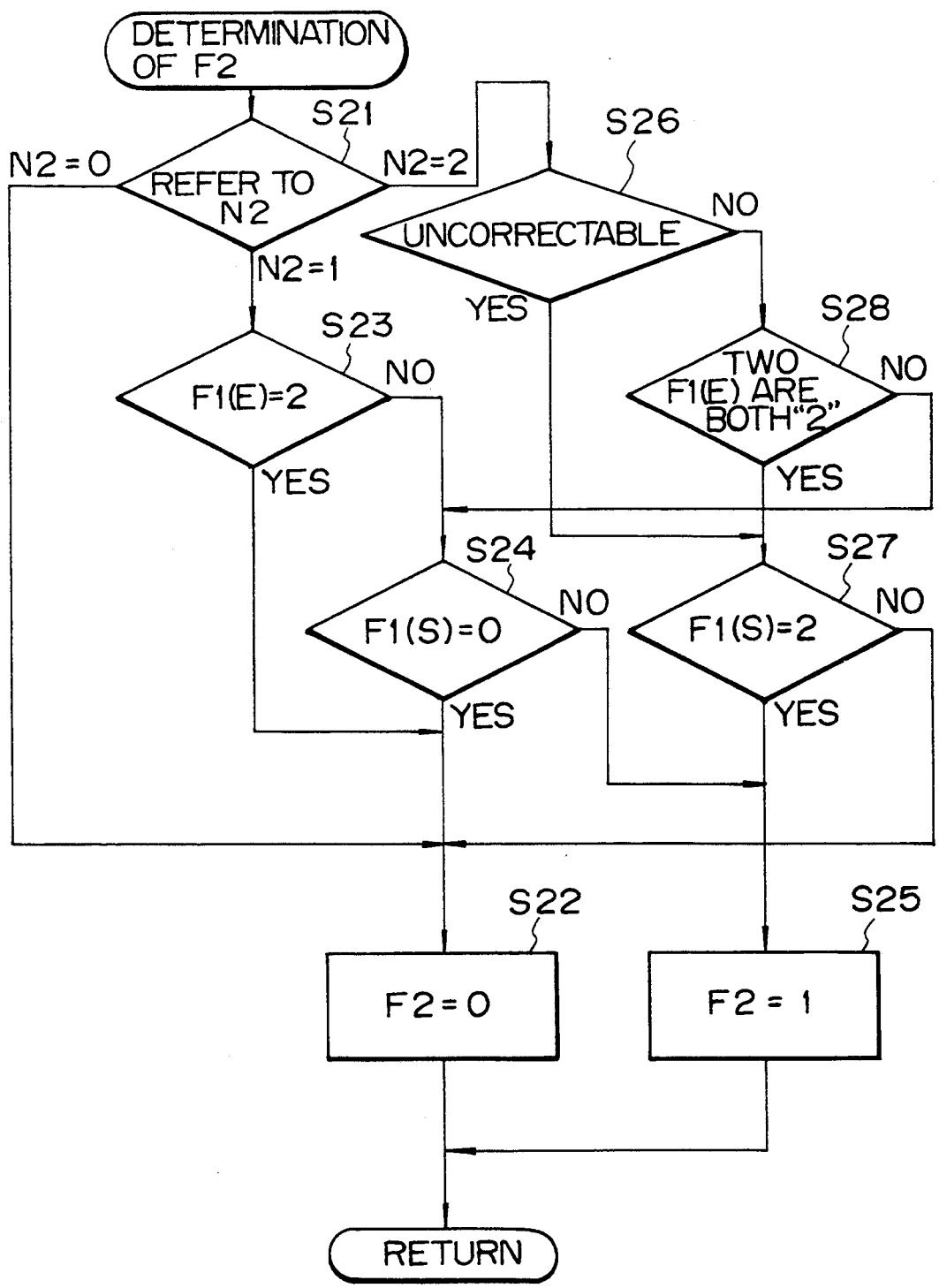

FIG. 6 shows a subroutine for step S5 in the main routine or the process of determining F2 for each symbol in the C2 code word. In this process, the value of N2 is determined (step S21), and if N2=0, the flag is set to "0" (step S22).

If it is judged that N2=1, it is determined whether or not F1(E) equals "2" (step S23). If F1(E)=2, the flag is set to "0" (step S22). If it is judged that F1(E) is either "1" or "0", it is discriminated whether or not the first flag for each symbol in the C2 code word (hereinafter simply called F1(S)) equals "0" (step S24). If it is judged that F1(S)=0, the flag is set to "0" (step S22). If it is not determined that F1(S)=0, the flag is set to "1" (step S25).

If it is judged in step S21 that N2=2, the flow branches to step S26 where it is determined whether or not correction is possible. This is because, like in the correction of C2 (FIG. 4), the maximum number of correctable errors with the C2 code is two, so that if there are actually three or more errors, the error positions cannot accurately be obtained, disabling the judgment of F1(E).

When it is determined in step 26 that no correction is possible, therefore, it is then judged whether or not F1(S) equals "2" (step S27). If F1(S)=2, the flag F2 is set to "1" (step S25). If it is judged in step S27 that F1(S) is either "0" or "1", the flag F2 is set to "0" (step S22). If it is judged correctable in step S26, it is then determined whether or not two flags F1(E) both equal "2" (step S28). If both flags F1(E) are judged to be "2", the flow advances to the decision step S27 and the subsequent step S22 or S25 will be executed. If it is not judged in step S28 that both flags F1(E) are "2", the flow advances to the decision step S24 and the subsequent step S22 or S25 will be executed. After F2 determination through the execution of step S22 or S25, the flow will return to the main routine.

Although correction is made when N2=1 and F1(E)=1 in FIG. 5, there should be no significant difference if correction were not made in this case. Whether it is better to make the correction or no correction would vary depending on the model of error occurrence. Since it is better to perform correction for the model of error occurrence which will be described later, the correction is to be made in the first embodiment. Likewise, although there should be no significant difference if correction were made when N2=2 and F1(E)=1, no correction is to be made in the first embodiment.

FIG. 7 shows the subroutine for the process of determining F2 in the form of a table. In this diagram, when N2=1 and F1(E)=0 or 1, or N2=2 and both F1(E) are not "2", then F2=1 under the condition of F1(S)=1. However, there should be no significant difference if F2=0 under this condition. This is because the second flag F2 would vary depending on the model of error occurrence, as in the above case of FIG. 5. In the first embodiment, F2 is set to "1". Assuming that correction is to be made when N2=2 and F1(E)=1, however, erroneous correction at the time a burst error occurs cannot be neglected, so that F2 is to be set to "1" if N2=2, F1(E)=1, X and F1(S)=1.

According to another embodiment of the first feature of the invention (hereinafter referred to as "second embodiment"), the C2 correcting process is the same as is shown in FIG. 5, but the process of determining F2 differs from the one in the first embodiment. FIG. 8 illustrates a table for the process of determining F2 according to the second embodiment. The difference between the first and second embodiments lies in the case of N2=2: F1(E) at only one of two error positions will be referred to in the second embodiment.

When the combination of the flags Fi(E) at two error positions becomes 0 and 2 or 1 and 2, the values in the table in FIG. 8 may be reversed or F2 may become unstable. For instance, when N2=2, F1(E)=0 or 1 and F1(S)=1, F2 may become "0", or when N2=2, F1(E)=2 and F1(S)=1, F2 may become "1".

As described with reference to the first embodiment, the reversing of the values would not raise any problem in the combination of 0 and 2. In the case of the combination of 1 and 2, however, assuming that correction is to be made when N2=2 and F1(E)=1, a problem would arise if F2 becomes "0" under the conditions of N2=2 and F1(E)=1. When any symbol with F1(S)=1 and N2=2 is at an error position, F2 should be set to "1" irrespective of F1(E).

Taking this measure overcomes the above problem and hardly causes a difference in the error correcting performance between the first and second embodiments.

Figure 9:
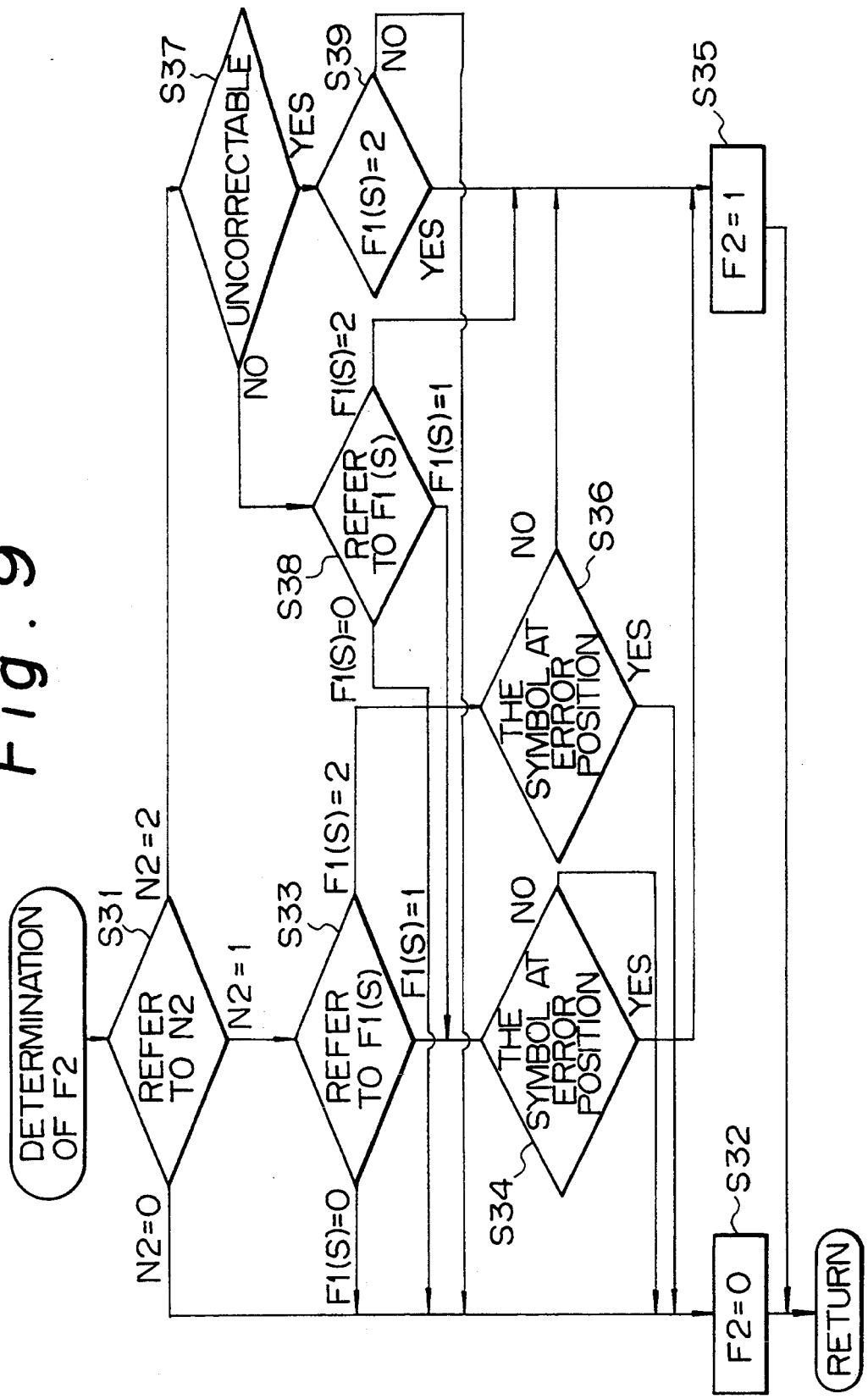

An embodiment of the second feature of the invention (hereinafter referred to as "third embodiment") will be described referring to FIGS. 9 and 10. FIG. 9 shows the subroutine for the process of determining F2. In this process, the value of N2 is determined in step S31, and if it is judged that N2=0, F2 is set to "0" (step S32). If it is judged that N2=1, the value of F1(S) is determined (step S33).

If it is judged that F1(S)=0 in step S33, the flow goes to step S32. If F1(S) is judged equal to "1", it is determined whether or not the symbol is at an error position (step S34). If it is judged that the symbol is at an error position, F2 is set to "1" (step S35); if it is not judged so, F2 is set to "0" (step S32).

If it is determined that F1(S)=2 in step S33, it is then judged whether or not the symbol is at error position (step S36). If it is judged that the symbol is at error position, F2 is set to "0" (step S32); if it is not judged so, F2 is set to "1" (step S35).

If it is judged in step S31 that N2=2, it is then determined whether or not correction is possible (step S38) as in the first embodiment. If it is judged correctable, the value of FI(S) is determined (step S38). If F1(S)=0, F2 is set to "0" (step S32). If F1(S)=1, the flow branches to step S34 followed by execution of step S32 or step S35. If F1(S)=2, F2 is set to "1" (step S35).

If it is judged in step S37 that no correction is possible, it is determined whether or not F1(S)=2 (step S39). If F1(S)=2, F2 is set to "1" (step S35), and if F1(S) is not equal to "2", F2 is set to "0" (step S32).

After determination of F2 in step S32 or S35, the flow will return to the main routine. FIG. 10 shows the subroutine in FIG. 9 in the form of a table.

According to the third embodiment, since it is unnecessary to refer to F1(E) before determining F2, the flag process is simpler and quicker than those executed in the first and second embodiments. The difference in the value of F2 depending on whether the symbol is at an error position can be dealt with simply by altering F2 at the error position at the time the error correction is executed.

Executing the process of determining F2 in the above manner results in the alteration of F2 with reference to first and second embodiment in conditions as have been described with reference to the first and second embodiments, for example, N2=1, F1(E)=0 or 1 and F1(S)=1, where the alteration of F2 would not cause a significant difference in the correcting performance.

In these conditions, the flag process for the symbol at an error position affects the error correcting performance more than the flag process for other symbols. Through the above processing of the third embodiment, the flag process for a symbol at an error position as well as the flag process for symbols in other conditions are the same as those done in the first embodiment. Therefore, the error correcting performance in the third embodiment is inferior to that in the first or second embodiment, but very slightly.

Another embodiment of the second feature of the invention (hereinafter referred to as "fourth embodiment") will be described referring to FIGS. 11 and 12. Although the above description of FIG. 2A has mentioned that F1 and N2 consist of two bits, F1 in the fourth embodiment consists of one bit. Therefore, in the flag process, F1 is set to "0" when the number of errors acquired with C1 is "0" or "1" or it is set to "1" when this number is "2" or greater, although the correction of C1 is the same as the one done in the first to third embodiments. The process of correcting C2 also differs from those shogun in FIGS. 4 and 5.

FIG. 11 illustrates the process of correcting C2 according to the fourth embodiment, while FIG. 12 illustrates the process of determining F2.

According to the fourth embodiment, since it is unnecessary to refer to F1(E) before determining F2 as per the third embodiment and F1 consists of one bit, the flag process is simpler than the one performed in the third embodiment.

The correction process for N2=1 and F1(E)=1 in FIG. 5 differs from the one in the third embodiment; however, there would not be significant influence as explained in the foregoing description of the first embodiment. The flag processing for N2=1, F1(S)=0 and L=1 as well as for N2=2, F1(S)=1 and L=1 in the third embodiment differs from what is done in the fourth embodiment. However, in the former case, if F2 is set to "1", its influence on the total occurrence probability of F2=1 is negligible. In the latter case, F2 at an error position is to be set to "0", but there would be no significant influence though slight deterioration would occur, because the correction for N2=2 and F1(E)=1 explained in the description of the first embodiment is not executed either in the fourth embodiment. Therefore, the error correcting performance in the fourth embodiment is slightly inferior to that in the third embodiment, but without a significant difference.

A detailed description will now be given of an error generating model to which the error correcting methods according to the first and second inventions are effectively applied.

The process of correcting C2 and the flag process in the first through fourth embodiments are designed so as to obtain a sufficiently low error rate after correction even if many errors have occurred. With an optical disk serving as a medium, a random symbol error rate being $10^2$, and ten burst errors on the average occurring on a disk 30 cm in diameter, each of a length corresponding to ten C1 code words and of a width corresponding to 100 tracks, the probability of occurrence of each of various possible errors is calculated for each combination of N2, F1(E) and F1(S), and the correcting process for C2 and the flag process are so determined as to minimize the error rate when correction up to C3 has been made.

The Reed-Solomon code on $GF(2^8)$ is used as an error correction code. When there are 54000 tracks, each as one correction block, on the disk, the aforementioned burst error model has the following probability $P_b$ that a burst error occurs on a X-Y plane.

$$P_b = \frac{\text{The number of } X\text{-}Y \text{ planes where a burst error occurs}}{\text{The total number of } X\text{-}Y \text{ planes on the disk}}$$
$$= \frac{10 \times 100}{54000 \times 30}$$
$$= 6.17 \times 10^{-4}$$

Figure 13A:
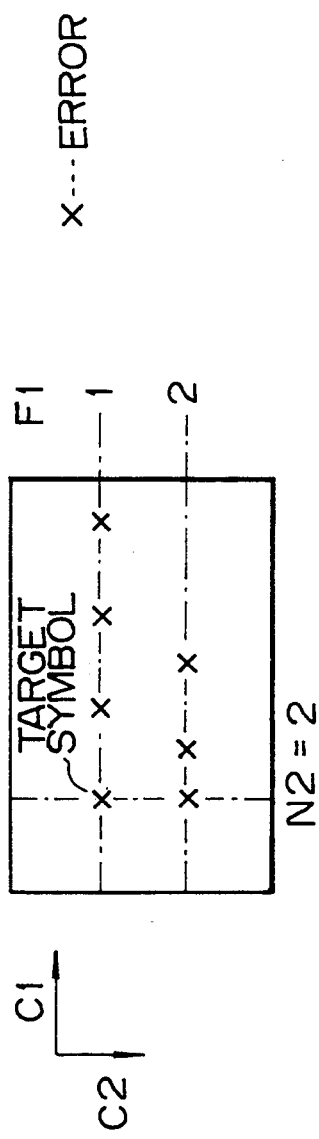
FIGS. 13A, 13B and 14 are diagrams illustrating error patterns concerning the correcting process and flag process according to the present invention.

In the process of correcting C2, whether or not correction is to be made is determined on based on if the error rate will be improved through the correction. If no correction is to be made when N2=2 and F1(E)=1, for example, the probability, $P_{ea}$, that random errors will occur on target symbols in the error pattern, as shown in FIG. 13A, is as follows.

$P_{ea}$ = (The number of possible positions in the C2 code where symbol uncorrectable with C1 can be located) ×

$P_{M11} \times P_1$
$= 49 \cdot P_{M11} \times P_1$ where $P_{M11}$ is the probability that there occur erroneous symbols with F1=1 after the correction of C1, and $P_1$ is the symbol error rate after the correction of C1. Both are approximated as follows with the probability according to the error pattern shown in FIG. 13A:

$$P_{M11} = \frac{5}{59} \cdot 59C_4 \cdot \frac{55}{255^3} \cdot P_s^4 = 1.28 \times 10^{-1} P_s^4$$

$$P_1 = 59C_3 P_s^3 \left\{ \frac{3}{59} \cdot \left(1 - \frac{56C_2}{255^2}\right) + \frac{5}{59} \cdot \frac{56C_2}{255^2} \right\}$$
$$= 1.68 \times 10^3 P_s^3$$

where $P_s$ is the symbol error rate before the correction of C1. When $P_s 10^{-2}$, $$P_{ea} = 49 \cdot (1.28 \times 10^{-1} \cdot P_s^4) \cdot (1.68 \times 10^3 \cdot P_s^3)$$
$$= 1.06 \times 10^{-10}$$

If correction is to be made for N2=2 and F1(E)=1, when the burst error and the random error occur in the pattern shown in FIG. 13B, the probability, $P_{eb}$, that erroneous correction on a target symbol will cause an error is as follows:

$P_{eb}$ = (the probability that no burst error occurs
on the target symbol) ×
(the probability that double erroneous
correction is caused by the burst error) ×
(the number of possible positions each of
which is one of the error positions
originating the erroneous correction and
is other than the position of the target symbol) ×
(the probability that the burst error occurs
on the X-Y plane) ×
(the probability that one random error occurs
in the C1 code word which includes the target
symbol)
$= \frac{40}{50} \cdot \frac{1}{255^2} \cdot 49 \cdot P_b \cdot 59 P_s (1 - P_s)^{58}$ Substituting $P_b = 6.17 \times 10^{-4}$ and $P_s = 10^{-2}$ into the above equation yields $P_{eb} = 1.23 \times 10^{-7}$ As $P_{eb} > P_{ea}$ in the above described error-occurring model, errors occur less if no correction is made. Therefore, no correction will be made when N2=2 and F1(E)=1.

Figure 13B:
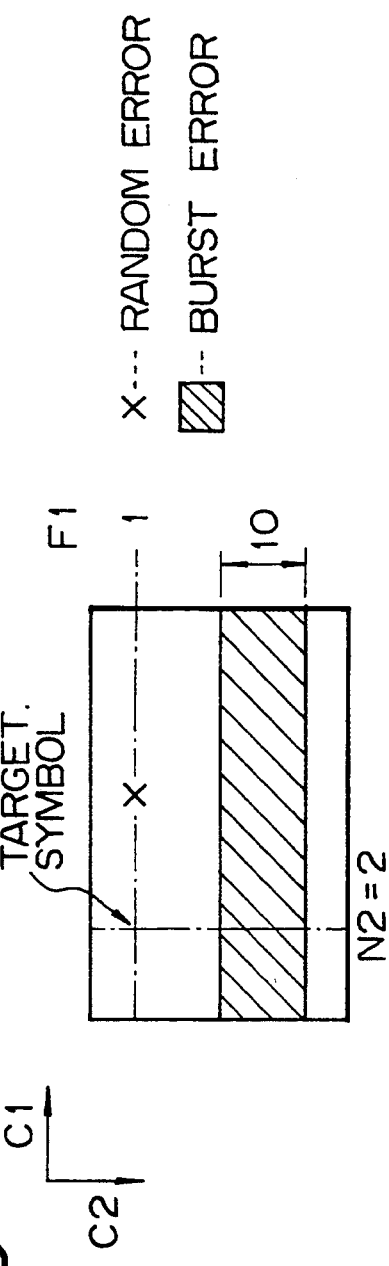

Likewise, in the flag process, the probability $P_{01}$ of generating a symbol in error with F2=0 and the probability $P_{10}$ of generating a correct symbol with F2=1 are calculated. Based on the results of the computation, it is checked which value of F2 lowers the error rate after the correction of C3 to thereby determine the value of F2. For example, in the first embodiment, when N2=2 and F1(E)=1, F2 of the symbol with F1(S)=1 is determined as follows:

With F2=0, since the target symbol in FIG. 13A has not been corrected and remains in error, $P_{01} = 1.06 \times 10^{-10}$ With F2=1, since the target symbol in FIG. 13B is not erroneously corrected and is thus correct, $$P_{10} = 1.23 \times 10^{-7}$$

The probability $P_{10}$ is expressed as $P_{10}=1.38\times10^{-4}$ when N2=2, F1(E)=2 and F1(S)=2. Since this value is dominant in the whole correction of C2, the former $P_{10}$ is sufficiently smaller than the latter so that it is negligible. $P_{01}$, however, is not small enough to be ignored as compared with all the other combinations of N2, F1(E) and F1(S), thus slightly lowering the error rate after the correction of C3. In this case, therefore, F2 is set to "1".

F2 should be determined in the same manner for the other combinations of N2, F1(E) and F1(S). However, when both $P_{01}$ and $P_{10}$ are non-negligible, it is checked through computation which value will lower the probability of causing an uncorrectable state or erroneous correction in C3, and then F2 is determined based on the computation result.

The correction and flag processes in the first through fourth embodiments have been determined in the above manner for each case. The reason why the number of errors, "2", is not distinguished from the number of errors, "3" or greater, with F1 is that when the number of errors is "3" or greater, there is a high probability that the number of errors is judged as "2" and also for the sake of simplifying the circuit structure.

Referring to F2, the correction of C3 is to be made. Syndrome correction and erasure correction should be used together to efficiently utilize the error correcting performance of C3. Particularly, since this invention is premised on the error-occurring model in which a burst error occurs at a certain probability, it is important to improve the error correcting performance using the erasure correction. Accordingly, it is necessary to reduce the erroneous symbols with F2=0, or to lower the probability $P_{01}$. To reduce the probability $P_{01}$, it is necessary to increase the number of cases where F2=1. The value of $P_{10}$ is thus set greater than that of $P_{01}$ and $P_{11}$ (the probability that a symbol with F2=1 is in error). In the light of the aforementioned points, the process of correction of C3 was changed in accordance with the number of the symbols with F2=1 in the C3 code word, and was determined as follows:

When the number of symbols with F2=1 is "2" or less, the syndrome correction will be effected.

This is because the syndrome correction can properly correct errors not only when symbols with F2=2 are actually in error, but also when a symbol of $P_{10}$ is included in the above two symbols and there also is a symbol of $P_{01}$.

When the number of symbols with F2=1 are "3" or "4", the erasure correction will be performed.

As long as $P_{01}$ is kept sufficiently low, the influence of erroneous correction done in the erasure correction can be neglected. Therefore, triple or quadruple error correction which is not possible by the syndrome correction can be ensured by the erasure correction, improving the error rate after the correction of C3. If $P_{10}$ is too high, the case where there are five or more symbols with F2=1 increases, reducing the chance of utilizing the erasure correction. In this respect, $P_{10}$ also has to be set small to a degree.

If there are five or more symbols with F2=1, the syndrome correction will be performed.

The erasure correction will not work in this case. Since $P_{10} > P_{11}$, however, it is very likely that the actual number of symbols in error is "2" or less even when there are five or more symbols with F2=1. Thus, the syndrome correction reduces the errors. Although there is a possibility of erroneous correction, this will not affect very much the total error rate after the correction, thus arising no problems. Such an erroneous correction can be detected if check symbols of an error detecting code are provided in the information area of the correction block and checking whether or not errors still exist after execution of the whole correction.

Figure 14:
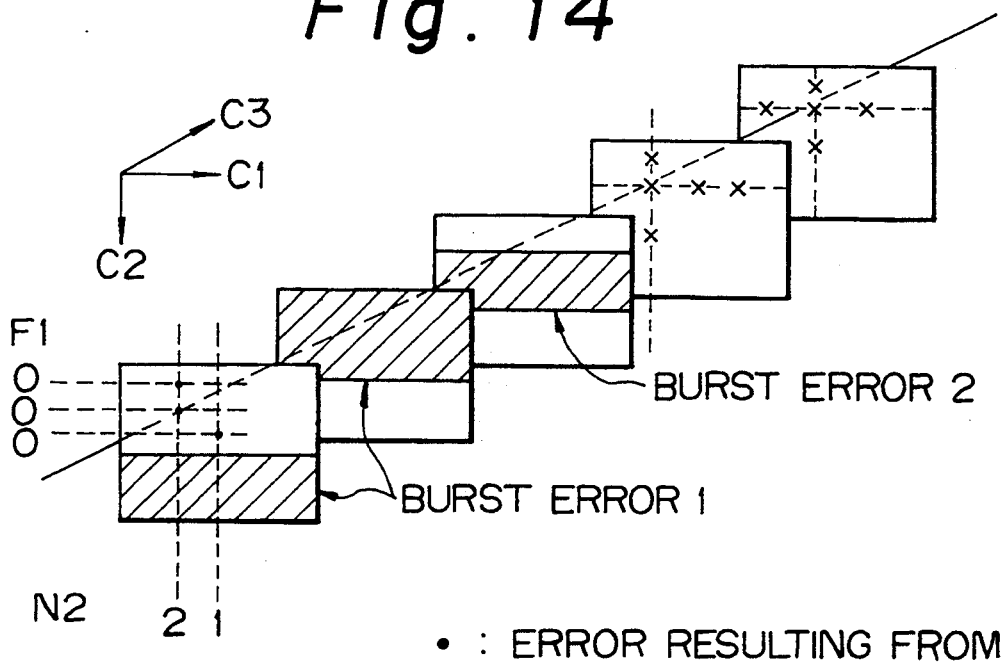

If erroneous correction occurs in the process of correction of C2, when a long burst error extending over multiple X-Y planes as shown in FIG. 14 or another burst error, and a random error occur, the probability that correction of C3 becomes impossible may increase. To prevent such erroneous correction, correction is prohibited in accordance with the values of N2 and F1(E) in the process of correction of C2.

Figure 15A:
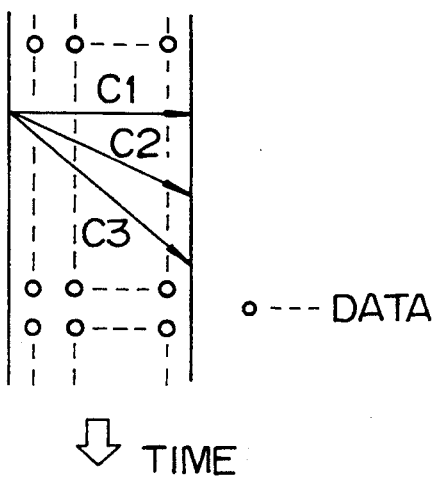
FIGS. 15A and 15B are diagrams showing another correction block which is the target for correction by the present invention.
Figure 15B:
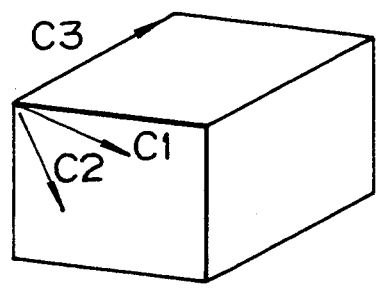

The correction block explained in the foregoing description of the first to fourth embodiments is a parallelepiped. As long as the correction block is assumed to be coded in three different directions, however, it may take any shape. For example, the correction block may be a continuous block coded in the oblique directions as shown in FIG. 15A, or a parallelepiped block with codes provided in the oblique directions as shown in FIG. 15B.

Although the Reed-Solomon codes with the minimum distance of 5 have been used as the codes C1, C2 and C3 in the above four embodiments, other kinds of codes may be used for the respective codes. When a different code is used for C3, L and M are not limited respectively to 2 and 4, but should automatically be determined depending on codes in use.

As described above, according to the error correcting methods for coded data of the first and second feature of the invention, in correcting errors of data having undergone triple coding for error correction with three codes in different directions, error correction is made with the first code and the first flag concerning the number of errors is generated. In performing error correction with the second code, the number of errors is acquired with the second code, whether or not correction at each error position is to be made with the second code is determined based on the number of errors and the first flag at each error position with the second code, and the second flag corresponding to each symbol in the second code is generated referring to the number of errors, the first flag at each error position, and the first flag for the each symbol in the second code, or referring to the number of errors and the first flag for the each symbol in the second code, and in accordance with whether or not the respective symbol in the second code is at an error position. In executing error correction with the third code, how to make the error correction is determined referring to the second flag.

According to this correction, not only a model involving random errors alone, but also a specific burst error model where multiple burst error blocks will occur at a given probability are considered. The correcting process and the flag process are therefore performed in the light of both random and burst errors, so that an error rate after correction can be made sufficiently small. The main specific effects of the present invention will be given below:

(1) In the correction with the second code, it is prohibited to correct a symbol for which the first flag acquired by the first code indicates no error or one error in some case. Therefore, erroneous correction due to a burst error can be suppressed.

(2) It is determined if correction with the second code can be made, referring to only the first flag at an error position is referred to, not the first flags of all the symbols in the second code word. Since symbols to be corrected can be read from a memory at the same time as the first flag is referred to, the correction requires less time, thus ensuring high-speed processing.

(3) As the second flag is determined referring to the number of errors in the second code word, the first flag of each symbol in the second code word, and the first flag at each error position or whether or not the symbol is at an error position, determination of the second flag will be accurately performed.

(4) In the correcting with the third code, when there are three or four symbols with the second flag being "1", the erasure correction is performed, and the syndrome correction is conducted otherwise. The synergistic effects of (1) and (3) above allow the third code to show high error correcting performance with respect to burst errors.

What is claimed is:

1. A method for correcting errors of data having undergone triple coding for error correction with three codes in different directions, the method comprising the steps of:

executing error correction with a first code and generating a first flag concerning a number of errors;

executing error correction with a second code, acquiring a number of errors in code words in the second code by using syndromes of said second code, determining whether or not correction at each error position of the second code is to be made based on the number of errors in the code words of the second code and on the first flag corresponding to each error position of the second code, and generating a second flag corresponding to each symbol in the second code based on the number of errors in the code words of the second code, the first flag generated for a symbol at each error position of the second code, and the first flag for each symbol in the second code;

determining a type of error correction for correcting code words of a third code based on the second flag; and executing be error correction determined for the third code.

2. A method according to claim 1, wherein the third code can make up to a first number of corrections (L) with the third code when error positions are unknown, and can correct up to a second number of corrections (M), where M >L, with the third code when error positions are known; and when the number of errors indicated by the second flag is equal to or less than L or equal to or greater than M+1, those symbols at error positions acquired with the third code are corrected with the third code, and when the number of errors is equal to or greater than L+1 and equal to or less than M, those symbols at error positions indicated by the second flag are corrected with the third code.

3. A method according to claim 1, wherein the first and second codes can both correct errors for two symbols, and the first flag indicates the number of errors acquired with the first code; and in the error correction with the second code, when the number of errors obtained with the second code is "0", no correction is executed, when the number of errors obtained with the second code is "1" or "2" and the first flag at the error position indicates no error, a symbol at the error position is not corrected, and when the number of errors obtained with the second code is "1" or "2" and the first flag at the error position indicates two or more errors, a symbol at the error position is corrected, the second flag is generated in such a manner that set and reset of the second flag respectively correspond to occurrence of an error and no error, when the number of errors acquired with the second code is "0", all symbols in a code word are reset, those symbols for which the first flag indicates no error are reset irrespective of the number of errors acquired with the second code, when the number of errors obtained with the second code is "1" and the first flag at the error position indicates no error or one error, those symbols in the code word for which the first flag indicates two or more errors are set, when the number of errors obtained with the second code is "1" and the first flag at the error position indicates two or more errors, all symbols in the code word are reset, when the number of errors obtained with the second code is "2" and the first flag at each of the error positions indicate two or more errors, those symbols in the code word for which the first flag indicates one error are reset, and when the number of errors obtained with the second code is "2", those symbols in the code word for which the first flag indicates two or more errors are set.

4. A method according to claim 1, wherein the first and second codes can both correct errors for two symbols, and the first flag indicates the number of errors acquired with the first code; and in the error correction with the second code, when the number of errors obtained with the second code is "0", no correction is executed, when the number of errors obtained with the second code is "1" or "2" and the first flag at the error position indicates no error, a symbol at the error position is not corrected, and when the number of errors obtained with the second code is "1" or "2" and the first flag at the error position indicates two or more errors, a symbol at the error position is corrected, the second flag is generated in such a manner that set and reset of the second flag respectively correspond to occurrence of an error and no error, when the number of errors acquired with the second code is "0", all symbols in a code word are reset, those symbols for which the first flag indicates no error are reset irrespective of the number of errors acquired with the second code, when the number of errors obtained with the second code is "1" and the first flag at the error position indicates no error or one error, those symbols in the code word for which the first flag indicates two or more errors are set, when the number of errors obtained with the second code is "1" and the first flag at the error position indicates two or more errors, all symbols in the code word are reset, when the number of errors obtained with the second code is "2", only the first flag at one of the error positions is checked, and if the first flag indicates two or more errors, those symbols in the code word for which the first flag indicates one error are reset, and when the number of errors obtained with the second code is "2", those symbols in the code word for which the first flag indicates two or more errors are set.

5. A method according to claim 4, wherein when the number of errors acquired with the second code is "2", the second flag for that of the symbols at the two error positions for which the first flag indicates one error, is set.

6. A method of correcting errors of data having undergone triple coding for error correction with three codes in different directions, the method comprising the steps of:

executing error correction with a first code and generating a first flag concerning a number of errors;

executing error correction with a second code, acquiring a number of errors in code words of the second code, by using syndromes of said second code, determining whether or not correction at each error position of the second code is to be made based on the number of errors in the code words of the second code and the first flag corresponding to each error position of the second code, and generating a second flag corresponding to each symbol in the second code based on the number of errors in the code words of the second code and the first flag for each symbol in the second code, and in accordance with whether or not each symbol in the second code is at an error position;

determining a type of error correction for correcting code words of a third code based on the second flag; and executing the error correction determined for the third code.

7. A method according to claim 6, wherein the third code can make up to a first number of corrections (L) with the third code when error positions are unknown, and can correct up to a second number of corrections (M), where M>L, with the third code when error positions are known; and when the number of errors indicated by the second flag is equal to or less than L or equal to or greater than M+1, those symbols at error positions acquired with the third code are corrected with the third code, and when the number of errors is equal to or greater than L+1 and equal to or less than M, those symbols at error positions indicated by the second flag are corrected with the third code.

8. A method according to claim 6, wherein the first and second codes can both correct errors for two symbols, and the first flag indicates the number of errors acquired with the first code; and in the error correction with the second code, when the number of errors obtained with the second code is "0", no correction is executed, when the number of errors obtained with the second code is "1" or "2" and the first flag at the error position indicates no error, a symbol at the error position is not corrected, and when the number of errors obtained with the second code is "1" or "2" and the first flag at the error position indicates two or more errors, a symbol at the error position is corrected, the second flag is generated in such a manner that set and reset of the second flag respectively correspond to occurrence of an error and no error, when the number of errors acquired with the second code is "0", all symbols in a code word are reset, those symbols for which the first flag indicates no error are reset irrespective of the number of errors acquired with the second code, when the number of errors obtained with the second code is "1", of symbols in the code word for which the first flag indicates one error, that symbol which matches the error position is set and those symbols which do not match the error position are reset, of symbols in the code word for which the first flag indicates two or more errors, those symbols which match the error positions are reset and those symbols which do not match the error positions are set, when the number of errors obtained with the second code is "2", of symbols in the code word for which the first flag indicates one error, those symbols which match the error positions are set and those symbols which do not match the error positions are reset, and when the number of errors obtained with the second code is "2", those symbols in the code word for which the first flag indicates two or more errors are set.

9. A method according to claim 6, wherein the first and second codes can both correct errors for two symbols; the first flag is reset when the number of errors obtained with the first code is equal to or less than "1", or is set when the number of errors is "2" or greater; and in the error correction with the second code, when the number of errors obtained with the second code is "0", no correction is executed, when the number of errors obtained with the second code is "1" or "2" and the first flag is reset, no correction is executed, and when the number of errors obtained with the second code is "1" or "2" and the first flag is set, correction is made, the second flag is generated in such a manner that set and reset of the second flag respectively correspond to occurrence of an error and no error, when the number of errors acquired with the second code is "0", all symbols in a code word are reset, when the number of errors obtained with the second code is "1", the first flag for that of symbols in the code word which is at the error position is inverted to serve as the second flag, and the first flag for each of other symbols is used directly as the second flag, and when the number of errors obtained with the second code is "2", the first flag of each symbol in the code word is used directly as the second flag.

10. A method according to claim 1, wherein the type of error correction for correcting code words of a third code is any one of (i) a correction by using error position information acquired by syndromes of the third code, (ii) a correction by using error position information indicated by the second flag, and (iii) a correction by using both types of error position information set forth in (i) and (ii).

11. A method according to claim 6, wherein the type of error correction for correcting code words of a third code is any one of (i) a correction by using error position information acquired by syndromes of the third code, (ii) a correction by using error position information indicated by the second flag, and (iii) a correction by using both types of error position information set forth in (i) and (ii).

* * * * *